United States Patent
Jun et al.

(10) Patent No.: US 6,552,399 B2
(45) Date of Patent: Apr. 22, 2003

(54) DUMMY LAYER DIODE STRUCTURES FOR ESD PROTECTION

(75) Inventors: Cai Jun, Singapore (SG); Lo Keng Foo, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/067,558

(22) Filed: Feb. 7, 2002

(65) Prior Publication Data

US 2002/0084485 A1 Jul. 4, 2002

Related U.S. Application Data

(62) Division of application No. 09/534,549, filed on Mar. 27, 2000, now Pat. No. 6,344,385.

(51) Int. Cl.$^7$ .............................................. H01L 23/62
(52) U.S. Cl. .................. 257/357; 257/358; 257/359; 257/360; 257/361
(58) Field of Search .............................. 257/357, 358, 257/359, 360, 361, 362, 176, 173, 363, 546; 438/239

(56) References Cited

U.S. PATENT DOCUMENTS 5,102,811 A * 4/1992 Scott .......................... 438/207
5,708,550 A   1/1998 Avery ......................... 361/56
5,780,905 A   7/1998 Chen et al. ................. 257/355
5,808,342 A   9/1998 Chen et al. ................. 257/357
5,850,095 A  12/1998 Chen et al. ................. 257/361
5,856,214 A   1/1999 Yu ............................. 438/133
6,015,992 A * 1/2000 Chatterjee et al. .......... 257/350
6,417,544 B1 * 7/2002 Jun et al. .................... 257/360

FOREIGN PATENT DOCUMENTS

JP           02158127 A  *  6/1990  .......... H01L/21/265

* cited by examiner

Primary Examiner—Wael Faburyl
Assistant Examiner—Nathan W. Ha
(74) Attorney, Agent, or Firm—George O. Saile; Rosemary L. S. Pike

(57) ABSTRACT

Described are structures for a device with a controllable dummy layer which can provide a low controllable trigger voltage and can be used as a first triggered device in ESD protection networks. A controllable dummy layer diode is provided which is structured as a butting diode with a dummy polysilicon layer above the butting region. The dummy polysilicon layer functions as an STI block to remove the STI between the n+ and p+ regions of the diode. In one embodiment the diode has the function of a controllable gate with a punchthrough-like-trigger, in which a capacitor-couple circuit couples a portion of the ESD voltage into the gate of the diode to provide a gate voltage. By changing the channel length under the gate of the diode as well as the gate voltage, the reverse-biased voltage of the diode is readily adjusted to a predetermined

28 Claims, 4 Drawing Sheets

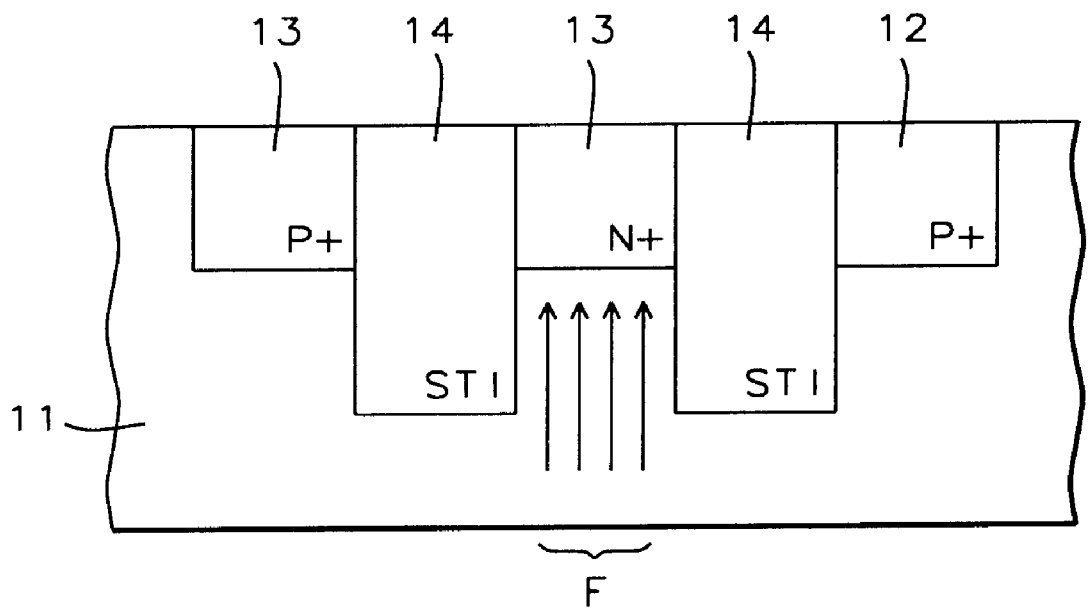
FIG. 1
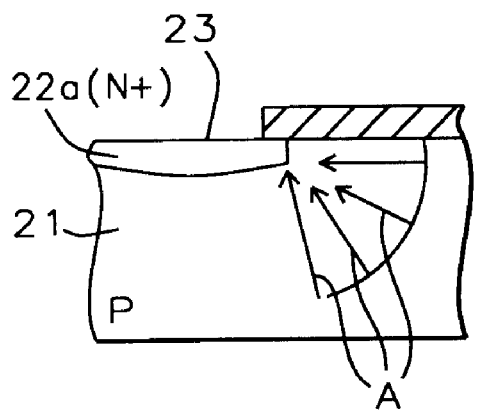 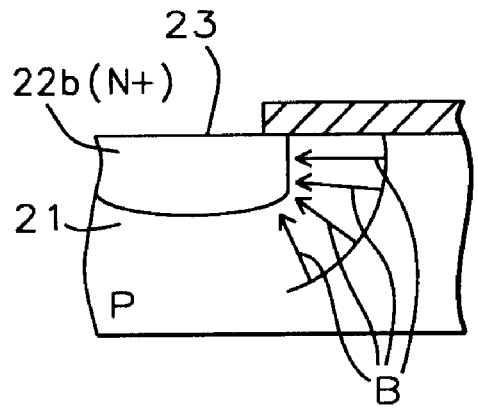
FIG. 2a    FIG. 2b

DUMMY LAYER DIODE STRUCTURES FOR ESD PROTECTION

This is a division of patent application Ser. No. 09/534,549, filing date Mar. 27, 2000, Dummy Layer Diode Structures For Esd Protection, assigned to the same assignee as the present invention, now U.S. Pat. No. 6,344,385.

BACKGROUND OF THE INVENTION

1. Field of the Invention

The invention relates to electrostatic discharge (ESD) protection of integrated circuits, and more particularly to reducing the avalanche breakdown voltage of diodes with shallow trench isolation (STI) in deep-quarter-micron processes.

2. Description of the Related Art

The avalanche breakdown voltage of a diode with shallow trench isolation (STI) has been increased to the level where these devices are no longer effective for ESD protection in deep quarter-micron processes. In this situation, the trigger voltage of the diode is higher than the gate oxide breakdown voltage. Thus, the protection window is zero. Diodes with the STI trigger too high fail when first triggered. The problem stems from the uniform electric field of the n+ junction of a diode which is responsible for the high breakdown, as indicated by Arrow F of FIG. 1. FIG. 1 depicts a cross-section of a semiconductor wafer with a p-well 11 having embedded two diodes with a p+ junction 12 each, and having a common n+ cathode 13. Shallow trench isolations 14 separate the p+ and n+ junctions. Therefore, it is essential to invent a new type of diode with a low and controllable trigger voltage.

U.S. Patents relevant to the subject at hand are listed below.

U.S. Pat. No. 5,708,550 (Avery) discloses an ESD protection structure having a dummy supply line.

U.S. Pat. No. 5,856,214 (Yu) shows a low voltage zener-triggered SCR for ESD.

U.S. Pat. No. 5,850,095 (Chen et al.) teaches an ESD protection circuit using a zener diode and an interdigitated NPN transistor.

U.S. Pat. No. 5,808,342 (Chen et al.) shows a bipolar SCR triggering circuit for ESD protection.

U.S. Pat. No. 5,780,905 (Chen et al.) describes an asymmetrical triggering ESD structure.

It should be noted that none of the above-cited examples of the related art utilize a device with a controllable dummy layer which provides a low controllable trigger voltage and which can be used as a first trigger device in ESD protection networks.

SUMMARY OF THE INVENTION

It is an object of the present invention to provide structures and a method for a device with a controllable dummy layer which can provide a low controllable trigger voltage and can be used as a first triggered device in ESD protection networks.

Another object of the present invention is to provide a device for ESD protection in deep-quarter micron processes.

A further object of the present invention is to reduce the avalanche breakdown voltage of the device and to make that breakdown voltage readily adjustable to a predetermined low level.

These objects have been achieved by providing a controllable dummy layer diode which is structured as a butting diode with a dummy polysilicon layer above the butting region. The dummy polysilicon layer functions as an STI block to remove the STI between the n+ and p+ regions of the diode. In one preferred embodiment of the invention the diode has the function of a controllable gate with a punchthrough-like-trigger, in which a capacitor-couple circuit couples a portion of the ESD voltage into the gate of the diode to provide a gate voltage. By changing the channel length under the gate of the diode as well as the gate voltage, the reverse-biased voltage of the diode is readily adjusted to a predetermined level. In a second preferred embodiment of the invention the p+ region of the diode is made to overlap the n+ region turning the diode into a zener diode. The low doping channel region under the dummy polysilicon layer functions as a channel stopper and suppresses the occurrence of the leakage current caused by the zener diode. The adjustment of the channel stopper length and the controllable gate voltage enables the controlling of a zener voltage.

BRIEF DESCRIPTION OF THE DRAWINGS

FIG. 1 is a cross-sectional view of two diodes with a common n+ junction and a uniform electric field across that n+ junction.

FIG. 2a and 2b illustrate the electric field crowding for a shallow and for a deep planar diffused junction, respectively.

FIG. 3b is a plan view of a portion of the cross-sectional view of FIG. 3a.

FIG. 5b is a plan view of a portion of the cross-sectional view of FIG. 5a.

DESCRIPTION OF THE PREFERRED EMBODIMENT

The junction of a diode with a shallow trench isolation (STI) is like some parallel plane junction with a high breakdown voltage. FIG. 2a shows a p-diffusion 21 with an n+ diffusion 22a illustrating a shallow planar diffused junction. Strong electric field crowding is indicated by the closeness of Arrows A at the surface 23 of the semiconductor wafer and results in a low breakdown voltage. In contrast, FIG. 2b shows a p-diffusion 21 with an n+ diffusion 22b illustrating a deep planar diffused junction. This deep planar diffusion approximates a parallel plane junction as illustrated in FIG. 1. The uniform and weaker electric field is indicated by the uniform spacing of Arrows B and results in the aforementioned higher breakdown voltage.

In the present invention two kinds of new devices with a controllable dummy layer provide a low and controllable trigger voltage for reducing the avalanche breakdown voltage of diodes in STI. These two newly invented devices can each be used as a first triggered device in electrostatic discharge (ESD) protection networks for deep-quarter-micron processes.

Key points of the present invention are:

Using a dummy polysilicon layer to remove the STI between n+ and p+ junctions.

Changing the breakdown point from the bottom of the n+/p+ junction to the surface of the semiconductor wafer, as illustrated in FIG. 2b and FIG. 2a, thereby making use of surface electric effects to control the breakdown voltage.

Using the punchthrough and zener concepts, disclosed subsequently, to reduce the diode-like-trigger voltage.

In the first preferred embodiment of the present invention the device is called a dummy layer punchthrough-like-trigger (DPLT) device. The DPLT device is a clamp device between a gate and a source of an inside n-channel transistor (MOS FET) for the protection of the MOS gate. The DPLT is structured as a butting diode with a dummy polysilicon layer above the butting region.

Figure 3A:
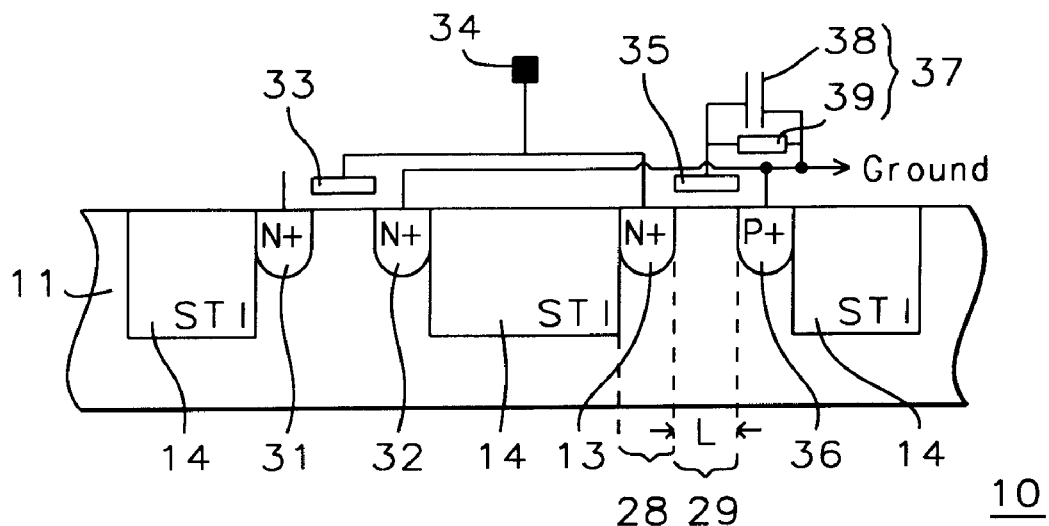
FIG. 3a is a cross-sectional view of the preferred embodiment of the dummy layer punchthrough-like-trigger device (DPLT) of the present invention.
Figure 3B:
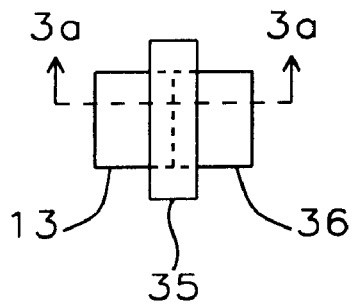

FIG. 3a illustrates the cross-section of a p-well or p-substrate 11 in a semiconductor wafer 10. A diode 28, comprised of p-well or p-substrate 11 as anode and n+ implant 13 as cathode, has a controllable dummy polysilicon layer 35 disposed as a clamp device between gate 33 and source 32 of a MOS type semiconductor device for MOS gate protection. The controllable dummy layer diode is structured as a butting diode with a dummy polysilicon layer 35 above the butting region, i.e. the region where n+ implant 13 and the adjacent p+ implant 36 meet. Also refer to the same items 13, 35, and 36 on the plan view of the diode in FIG. 3b. The dummy polysilicon layer 35 functions as an STI block to remove the STI between the n+ and p+ regions, items 13 and 36 respectively. STI regions 14 separate drain 31 and source 32 from components 13 and 36 and from other structures (not shown). The diode has a controllable gate 35 with a punchthrough-like-trigger, in which a capacitor-couple circuit 37, typically comprised of a capacitor 38 and resistive means 39, couples a portion of an electrostatic discharge (ESD) voltage into gate 35 to provide a gate voltage for the diode in an ESD event. By changing the length L of channel 29 of the diode as well as the gate voltage, the reverse-biased voltage of the diode is readily adjusted to a predetermined level.

Gate 33 and n+ implant 13 are connected to integrated circuit (IC) pad 34 of the chip. Source 32 and p+ implant 36 are typically tied to ground. Capacitor couple circuit 37 is tied at one end to gate 35, as already mentioned, and to ground at the other end. By changing the channel length of the DPLT the punchthrough voltage of the DPLT is changed. Changing the gate voltage of the DPLT changes the depletion region profile under the dummy polysilicon layer. The change of the depletion region profile in turn changes the punchthrough voltage of the DPLT. When the gate voltage exceeds the threshold voltage of the MOS type semiconductor device a zener-like diode appears between the p+/n type inversion layer which is in parallel with the channel depletion region.

Figure 4:
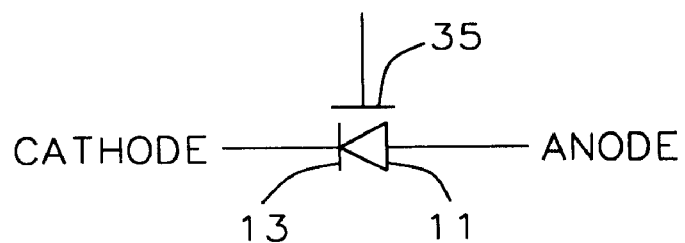
FIG. 4 is a schematic diagram of the DPLT device.

The effect of gate coupling on the surface electric field of the n+/p-well or p-substrate junction is to lower the junction breakdown voltage. FIG. 4 is a schematic diagram of diode 28, showing p-well 11, n+ region 13, and gate 35. The advantage of this first preferred embodiment of the present invention is that all of this makes the reverse-biased voltage of the DPLT readily adjustable to a predetermined low level.

Figure 5A:
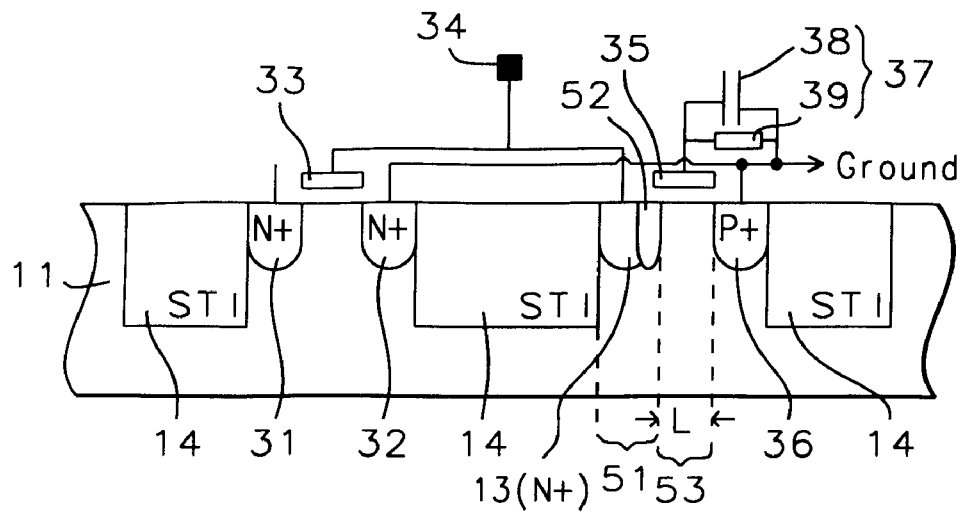
FIG. 5a is a cross-sectional view of the preferred embodiment of the dummy layer zener-like-trigger device (DZLT) of the present invention.
Figure 5B:
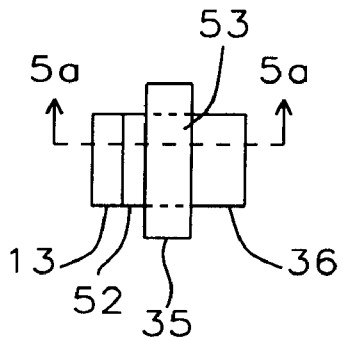

We will now discuss the second preferred embodiment of the present invention by referring to FIG. 5a and FIG. 5b. The device is called a dummy layer zener-like-trigger (DZLT) device. Attention is directed to the fact that most features are the same as those of FIG. 3a and FIG. 3b, where the same numerals designate the same component. When overlapping p+ region 52 of diode 51 is disposed to overlap n+ region 13, the structure is functioning as a zener-type diode. The low doping channel 53 region, of length L, under the dummy polysilicon layer 35 functions as a channel stopper, and suppresses the occurrence of the leakage current caused by the zener type diode. The adjustment of the channel 53 stopper length and the controllable gate voltage enables the controlling of a Zener voltage. When ESD stress is present at the IC pad 34 diode 51 goes into a controllable voltage breakdown. Accordingly, the ESD stress at IC pad 34 is bypassed by the conduction of the diode and the conduction of the whole ESD protection network to thus allow an internal circuit to be protected from ESD damage. FIG. 5b is the top view of diode 51, n+ implant 13, overlapping p+ implant 52, polysilicon gate 35 above channel 53, and p+ implant 36.

The DZLT device is a clamp device between gate 33 and source 32 of an inside MOS FET for the protection of the MOS gate 33. The dummy polysilicon layer 35 functions as a STI block to remove the STI 14 between the n+ 13 cathode/p+ overlapping region 52 and the p+ anode 11 of the DZLT. Analogous to the DPLT device discussed previously, a capacitor-couple circuit 37, typically comprised of a capacitor 38 and resistive means 39, couples a portion of an ESD voltage into gate 35 to provide a gate voltage for the diode in an ESD event. The DZLT has a controllable gate 35 with a zener-like-trigger. The DZLT is structured as a zener diode with a dummy polysilicon layer, gate 35, above the overlapping region of p+ (36) to n+ (13), in which the DZLT can act as a zener-like diode 51 with a gate control channel stopper 53 to suppress leakage currents of diode 51 and to adjust the clamp voltage.

Figure 6:
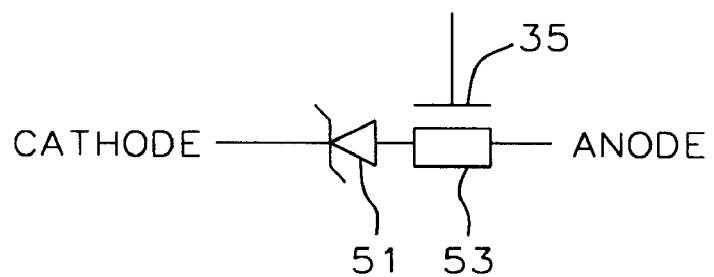
FIG. 6 is a schematic diagram of the DZLT device.

FIG. 6 is a schematic diagram of the DZLT device showing zener-type diode 51 connected to channel 53 and gate 35 disposed above channel 53. Also indicated are the cathode and anode of the DZLT device.

By changing the channel stopper length of the DZLT the channel stopper resistor is changed, which changes the clamp voltage of the DZLT. By changing the gate voltage of the DZLT the channel stopper resistor is changed, which in turn changes the clamp voltage of the DZLT. The advantage of this second preferred embodiment of the present invention is that all of this makes the clamp voltage of the DZLT readily adjustable to a predetermined low level.

Figure 7:
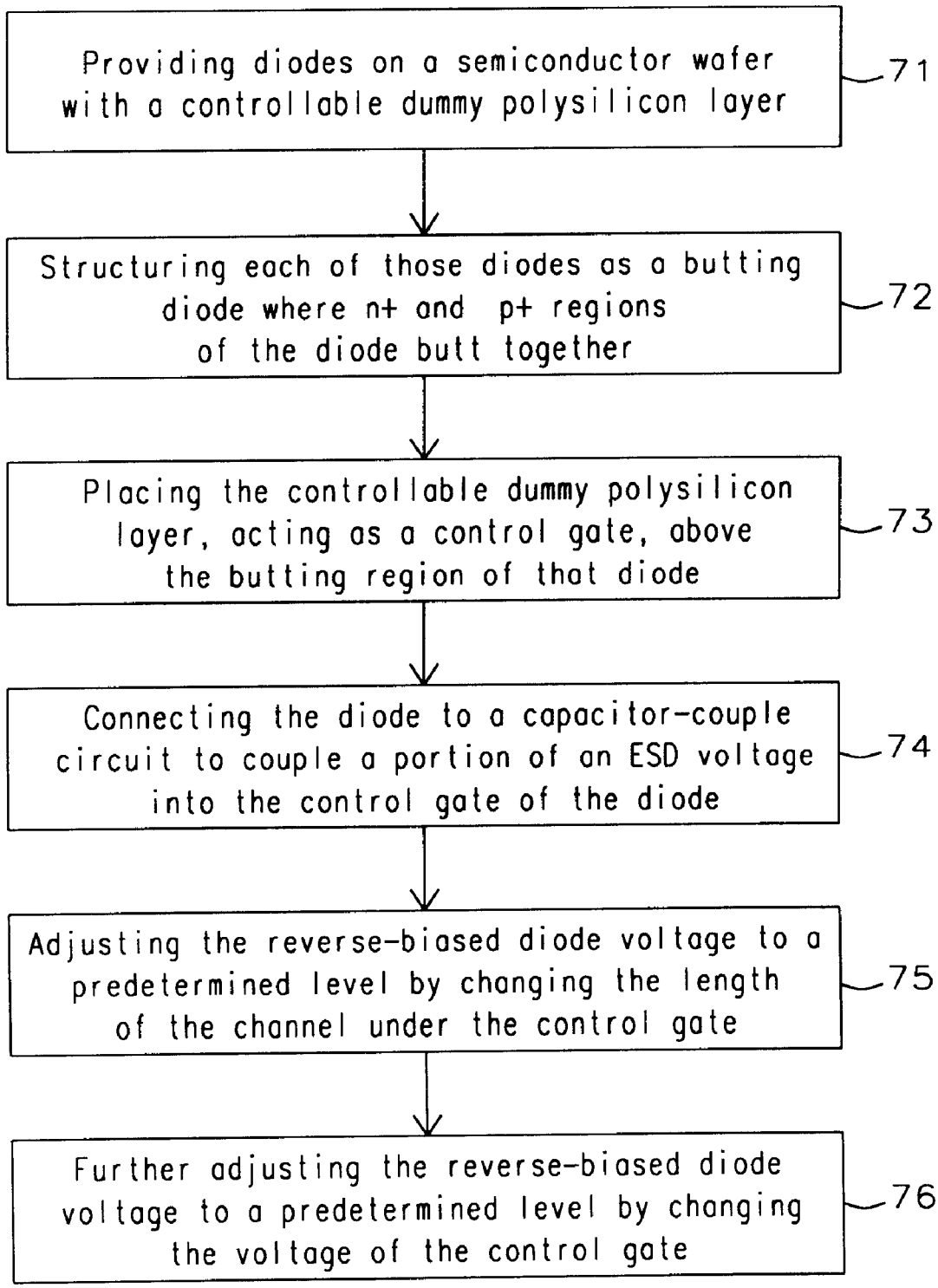
FIG. 7 is a block diagram of the method of the invention.

With reference to block diagram, FIG. 7, we now describe the method of creating a device with a controllable dummy layer structure for electrostatic discharge (ESD) protection, which comprises the following steps:

providing a semiconductor wafer having a p-well, implanting diodes and n-channel transistors in that p-well, providing each of those diodes with a controllable dummy polysilicon layer, where those diodes are disposed as a clamp device between a gate and a source of the n-channel transistor for the protection of the gate from ESD, see BLOCK 71, structuring that diode as a butting diode, where the butting region is defined by the area between the n+ region of the diode and the p-well, see BLOCK 72, placing the controllable dummy polysilicon layer above the butting region of the diode, where the controllable dummy polysilicon layer acts as a control gate for the diode, see BLOCK 73, connecting the diode to a capacitor-couple circuit to couple a portion of an ESD voltage into the control gate of the diode, thus providing a gate voltage for the control gate, see BLOCK 74, adjusting the reverse-biased diode voltage to a predetermined level by changing the length of the aforementioned channel, see BLOCK 75, and further adjusting the reverse-biased diode voltage to a predetermined level by changing the voltage of the control gate, see BLOCK 76.

The method further provides that:

the controllable dummy polysilicon layer functions as a shallow trench isolation (STI) block to remove the STI between the n+ region of the diode and the p-well or p-substrate, the diode functions as a controllable gate with a punchthrough-like-trigger, the diode further functions as a zener type diode when the p+ region of the diode is disposed to overlap the n+ region of the diode, a low doping channel region under the controllable dummy polysilicon layer functions as a channel stopper, the low doping channel region of the zener type diode suppresses the occurrence of leakage currents caused by the zener type diode, adjusting the length of the channel stopper enables the controlling of the zener voltage of the zener type diode, controlling the voltage the control gate enables the controlling of the zener voltage of the zener type diode, when ESD stress is present at the gate of the n-channel transistor, the diode goes into a controllable voltage level breakdown, the ESD stress is bypassed by the conduction of the diode.

While the invention has been particularly shown and described with reference to the preferred embodiments thereof, it will be understood by those skilled in the art that various changes in form and details may be made without departing from the spirit and scope of the invention.

What is claimed is:

1. A device having a Dummy layer Punchthrough-Like-Trigger (DPLT) structure for electrostatic discharge (ESD) protection, comprising:
    a semiconductor wafer with a p-substrate;
    said p-substrate implanted with diodes and n-channel transistors, where each of said n-channel transistors is associated with one of said diodes;
    said n-channel transistors and said diodes separated by shallow trench isolations (STI);
    a dummy polysilicon layer placed over of the channel separating each of the n+ regions of said diodes and adjacent p+ regions, said diodes called zener-like-diodes;
    said n+ region of said diode connected through conductive means to a gate of its associated n-channel transistor;
    said DPLT used as a first triggered device in electrostatic discharge (ESD) protection networks;
    each of said diodes comprised of said n+ region as cathode and said p-substrate as anode;
    said dummy polysilicon layer connected through capacitor-couple means to a reference voltage; and
    during ESD stress, at the input to said DPLT, said diodes go into a controllable voltage level breakdown.

2. The device of claim 1, wherein said DPLT is a clamp device between a gate and said source of said n-channel transistor for the protection of said gate in an ESD event.

3. The device of claim 1, wherein said n-channel transistor is an inside n-channel transistor of a circuit.

4. The device of claim 1, wherein said DPLT has a controllable gate with a punchthrough-like-trigger.

5. The device of claim 4, wherein, in an ESD event, said capacitor-couple circuit couples a portion of an ESD voltage into said controllable gate.

6. The device of claim 1, wherein said DPLT is structured as a butting diode, said n+ region of said diode and said p-substrate butting against each other.

7. The device of claim 1, wherein said dummy polysilicon layer functions as an STI block removing the effect of said STI between said n+ region of said diode and said adjacent p+ region.

8. The device of claim 1, wherein said dummy polysilicon layer changes the breakdown point of said diode from the bottom of said n+ region and said p-substrate region to the region near the surface of said n+ region and said p-substrate.

9. The device of claim 1, wherein changing the length of said channel changes the punch-through voltage of said DPLT.

10. The device of claim 1, wherein changing the gate voltage of said DPLT changes the depletion region profile under said dummy polysilicon layer.

11. The device of claim 10, wherein changing said depletion region profile changes the punch-through voltage of said DPLT.

12. The device of claim 11, wherein, when the gate voltage of said n-channel transistor exceeds a threshold voltage, there appears said zener-like-diode between the p+/n inversion layer of said diode.

13. The device of claim 12, wherein there appears a channel depletion region under said dummy polysilicon layer as a result of the appearance of said p+/n inversion layer.

14. The device of claim n–1, wherein the effect of gate coupling of said dummy polysilicon layer on the surface electric field of the n+/p-well junction of said diode lowers the junction breakdown voltage of said diode.

15. A device having a Dummy layer Zener-Like-Trigger (DZLT) structure for electrostatic discharge (ESD) protection, comprising:
    a semiconductor wafer with a p-substrate;
    said p-substrate implanted with diodes and n-channel transistors, where each of said n-channel transistors is associated with one of said diodes, said diodes called zener-like-diodes;
    said n-channel transistors and said diodes separated by shallow trench isolations (STI);
    each of said diodes comprised of an n+ and an overlapping p+ region, said overlapping p+ regions overlapping said n+ regions of said diodes;
    second p+ regions placed adjacent to each said overlapping p+ regions;
    a dummy polysilicon layer placed over of the channel separating of each of said second p+ and said overlapping p+ regions of said diodes;
    said dummy polysilicon layer creating a controllable trigger gate;
    said n+ region of said diode connected through conductive means to the gate of its associated n-channel transistor;
    said DZLT used as a first triggered device in electrostatic discharge (ESD) protection networks;
    said DZLT acting as a clamp between said gate and said source of said n-channel transistor for the protection of said gate of said n-channel transistor in an ESD event;
    said dummy polysilicon layer connected through a capacitor-couple circuit to a reference voltage; and said diodes going into a controllable voltage breakdown, during ESD stress at the input to said DZLT.

16. The device of claim 15, wherein said n-channel transistor is an inside N-channel transistor of a circuit.

17. The device of claim 15, wherein said controllable trigger gate is a zener-like-trigger.

18. The device of claim 17, wherein a capacitor-couple circuit couples a portion of an ESD voltage, in an ESD event, into said controllable trigger gate.

19. The device of claim 15, wherein low doping of the area of said channel under said dummy polysilicon layer functions as a channel stopper, thereby suppressing the occurrence of leakage current caused by said zener-like-diode.

20. The device of claim 19, wherein said DZLT acts as said zener-like-diode in series with a gate control channel stopper.

21. The device of claim 20, wherein said zener-like-diode in series with said gate control channel stopper suppresses leakage.

22. The device of claim 20, wherein said zener-like-diode in series with said gate control channel stopper adjusts the voltage of said clamp.

23. The device of claim 15, wherein said dummy polysilicon layer functions as an STI block removing the effect of said STI between said n+ and overlapping p+ regions of said diode and said second p+ region.

24. The device of claim 15, wherein said dummy polysilicon layer changes the breakdown point of said diode from the bottom of said n+ and overlapping p+ regions to the region near the p-substrate surface of said n+ and overlapping p+ regions.

25. The device of claim 15, wherein changing the length of a channel stopper changes the resistance of said channel stopper.

26. The device of claim 25, wherein changing the resistance of said channel stopper changes the clamp voltage of said DZLT.

27. The device of claim 15, wherein changing the gate voltage of said DZLT changes the resistance of a channel stopper.

28. The device of claim 27, wherein changing the resistance of said channel stopper changes the clamp voltage of said DZLT.

* * * * *